(12) United States Patent
Rockwell

(10) Patent No.: US 11,658,455 B2
(45) Date of Patent: May 23, 2023

(54) RAMAN AMPLIFIER SUPPORTING HIGH OUTPUT POWER AND HIGH BEAM QUALITY

(71) Applicant: Raytheon Company, Waltham, MA (US)

(72) Inventor: David A. Rockwell, Culver City, CA (US)

(73) Assignee: Raytheon Company, Waltham, MA (US)

(*) Notice: Subject to any disclaimer, the term of this patent is extended or adjusted under 35 U.S.C. 154(b) by 425 days.

(21) Appl. No.: 16/837,599

(22) Filed: Apr. 1, 2020

(65) Prior Publication Data

US 2021/0313758 A1    Oct. 7, 2021

(51) Int. Cl.
*H01S 3/30* (2006.01)
*H01S 3/094* (2006.01)
*H01S 3/0941* (2006.01)

(52) U.S. Cl.
CPC ............ *H01S 3/302* (2013.01); *H01S 3/0941* (2013.01); *H01S 3/094003* (2013.01)

(58) Field of Classification Search
CPC .... H01S 3/302; H01S 3/94007; H01S 3/0941; H01S 3/094096; G02B 6/02028
See application file for complete search history.

(56) References Cited

U.S. PATENT DOCUMENTS

| | | | |
|---|---|---|---|
| 5,121,460 A | 6/1992 | Tumminelli et al. | |
| 5,864,644 A | 1/1999 | DiGiovanni et al. | |
| 8,948,218 B2 | 2/2015 | Gapontsev et al. | |
| 9,293,888 B2 | 3/2016 | Rockwell et al. | |
| 2003/0142393 A1* | 7/2003 | Kuksenkov | H01S 3/06791 359/341.1 |
| 2005/0024716 A1 | 2/2005 | Nilsson et al. | |
| 2005/0078353 A1* | 4/2005 | Komine | G02B 6/02042 359/334 |
| 2011/0305250 A1 | 12/2011 | Chann et al. | |
| 2015/0117473 A1* | 4/2015 | Rockwell | H01S 3/06754 385/127 |

(Continued)

OTHER PUBLICATIONS

Ji et al., "Analysis of the Conversion to the First Stokes in Cladding-Pumped Fiber Raman Amplifiers", IEEE Journal of Selected Topics in Quantum Electronics, vol. 15, No. 1, Jan./Feb. 2009, p. 129-139.

(Continued)

*Primary Examiner* — Eric L Bolda

(57) ABSTRACT

A system includes a seed laser configured to generate a seed beam and multiple arrays of semiconductor diode lasers configured to generate multiple pump beams. The system also includes a Raman amplifier having a core, a first cladding around the core, and at least a second cladding around the first cladding. The core is configured to amplify the seed beam based on optical pump power provided by the pump beams. Each of the core, the first cladding, and the second cladding includes fused silica, and at least the core and the first cladding are doped. The core has a numerical aperture of approximately 0.06 or less and a diameter of approximately 20 μm to approximately 25 μm. The first cladding has a numerical aperture of approximately 0.17 or less and a diameter of approximately 35 μm to approximately 45 μm.

24 Claims, 5 Drawing Sheets

(56) References Cited

U.S. PATENT DOCUMENTS

2019/0103917 A1* 4/2019 Gnauck ............. H01S 3/094046

OTHER PUBLICATIONS

Agrawal, "Nonlinear Fiber Optics", Third Edition, Jan. 29, 2001, 2 pages.
Hong et al., "Wide-Span Multi-Wavelength High-Power Diode-Laser Pumping of Fiber Raman Laser", IEEE Photonics Technology Letters, vol. 31, No. 24, Dec. 2019, p. 1995-1998.
Tankala et al., "New Developments in High Power Eye-Safe LMA Fibers", Proceedings SPIE 6102, Fiber Lasers III: Technology, Systems, and Applications, Feb. 2006, 9 pages.
Jollovet et al., "Design optimization of Tm-doped large-mode area fibers for power scaling of 2μm lasers and amplifiers", Proc. of SPIE, vol. 10083, Mar. 2017, 7 pages.
Frith et al., "Power Scalable and Efficient 790nm pumped Tm3+-Doped Fibre Lasers", Proc. SPIE 6102, Fiber Lasers III: Technology, Systems, and Applications, Feb. 2006, 10 pages.
Khitrov et al., "A 25/300 Erbium-Ytterbium Co-doped Fiber For Use in High Power, Low-ASE Amplifier Applications", www.nufern.com, Dec. 2009, 13 pages.
Simakov et al., "Design and experimental demonstration of a large pedestal thulium-doped fibre", Optics Express, vol. 23, No. 3, Feb. 2015, 8 pages.
Laperle et al., "Yb-doped LMA triple-clad fiber for power amplifiers", Proc. SPIE 6453, Fiber Lasers IV: Technology, Systems, and Application, Feb. 2007, 12 pages.
Shamir et al., "250 W clad pumped Raman all-fiber laser with brightness enhancement", Optics Letters, vol. 43, No. 4, Feb. 2018, 4 pages.
Glick et al., "1.2 kW clad pumped Raman all-passive-fiber laser with brightness enhancement", Optics Letters, vol. 43, No. 19, Oct. 2018, 4 pages.
Marciante et al., "Near-diffraction-limited operation of step-index large-mode-area fiber lasers via gain filtering", Optics Letters, vol. 35, No. 11, Jun. 2010, 3 pages.
Galeener et al., "The relative Raman cross sections of vitreous $SiO_2$, $GeO_2$, $B_2O_3$, and $P_2O_5$", Appl. Phys. Lett. 32 (1), Jan. 1978, 3 pages.
Fukai et al., "Effective Raman gain characteristics in germanium- and fluorine-doped optical fibers", Optics Letters, vol. 29, No. 6, Mar. 2004, 3 pages.
Yao et al., "High-Power Continuous-Wave Directly-Diode-Pumped Fiber Raman Lasers", Applied Sciences, Nov. 2015, 14 pages.
Di Teodoro et al., "System and Method for Spectral Line Shape Optimization for Spectral Beam Combining of Fiber Lasers", U.S. Appl. No. 16/517,394, filed Jul. 19, 2019, 42 pages.
Harish et al., "Suppression of Stimulated Brillouin Scattering in Single-Frequency Fiber Raman Amplifier Through Pump Modulation", Journal of Lightwave Technology, vol. 37, No. 13, Jul. 2019, 10 pages.
Liu et al., "Intrinsic Mechanism for Spectral Evolution in Single-Frequency Raman Fiber Amplifier", IEEE Journal of Selected Topics in Quantum Electronics, vol. 24, No. 5, Sep./Oct. 2018, 8 pages.
Jackson et al., "Directly diode-pumped holmium fiber lasers", Optics Letters, vol. 32, No. 17, Sep. 2007, 3 pages.
Chen et al., "Pure Passive Fiber Enabled Highly Efficient Raman Fiber Amplifier with Record Kilowatt Power", IEEE Access, vol. 7, Feb. 2019, 6 pages.
International Search Report dated Mar. 4, 2021 in connection with International Patent Application No. PCT/US2020/062621, 4 pages.
Written Opinion of the International Searching Authority dated Mar. 4, 2021 in connection with International Patent Application No. PCT/US2020/062621, 8 pages.

* cited by examiner

RAMAN AMPLIFIER SUPPORTING HIGH OUTPUT POWER AND HIGH BEAM QUALITY

TECHNICAL FIELD

This disclosure is generally directed to optical amplifiers used for light amplification. More specifically, this disclosure is directed to a Raman amplifier supporting high output power and high beam quality.

BACKGROUND

Laser systems that output high-quality beams can be used in a number of applications. For example, low-noise, high-power amplifiers may be used in telecommunication systems to support the transport of information over very long distances. Some laser systems use fiber amplifiers to amplify light, meaning the light is amplified within optical fibers that are transporting the light. A fiber amplifier often includes a core and at least one cladding around the core, where light travels through the core and is amplified by active lasing ions within the core. Optical pump power provided into the core and an innermost cladding provides the necessary energy for the optical amplification within the core.

SUMMARY

This disclosure provides a Raman amplifier supporting high output power and high beam quality.

In a first embodiment, a system includes a seed laser configured to generate a seed beam and multiple arrays of semiconductor diode lasers configured to generate multiple pump beams. The system also includes a Raman amplifier having a core, a first cladding around the core, and at least a second cladding around the first cladding. The core is configured to amplify the seed beam based on optical pump power provided by the pump beams. Each of the core, the first cladding, and the second cladding includes fused silica, and at least the core and the first cladding are doped. The core has a numerical aperture of approximately 0.06 or less and a diameter of approximately 20 µm to approximately 25 µm. The first cladding has a numerical aperture of approximately 0.17 or less and a diameter of approximately 35 µm to approximately 45 µm.

In a second embodiment, an apparatus includes a Raman amplifier having a core, a first cladding around the core, and at least a second cladding around the first cladding. The core is configured to receive a seed beam, the core and the first cladding are configured to receive at least one pump beam, and the core is configured to amplify the seed beam based on optical pump power provided by the at least one pump beam. Each of the core, the first cladding, and the second cladding includes fused silica, and at least the core and the first cladding are doped. The core has a numerical aperture of approximately 0.06 or less and a diameter of approximately 20 µm to approximately 25 µm. The first cladding has a numerical aperture of approximately 0.17 or less and a diameter of approximately 35 µm to approximately 45 µm.

In a third embodiment, a method includes receiving a seed beam and at least one pump beam at a Raman amplifier. The Raman amplifier includes a core, a first cladding around the core, and at least a second cladding around the first cladding. The method also includes amplifying the seed beam in the core of the Raman amplifier based on optical pump power provided by the at least one pump beam. Each of the core, the first cladding, and the second cladding includes fused silica, and at least the core and the first cladding are doped. The core has a numerical aperture of approximately 0.06 or less and a diameter of approximately 20 µm to approximately 25 µm. The first cladding has a numerical aperture of approximately 0.17 or less and a diameter of approximately 35 µm to approximately 45 µm.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
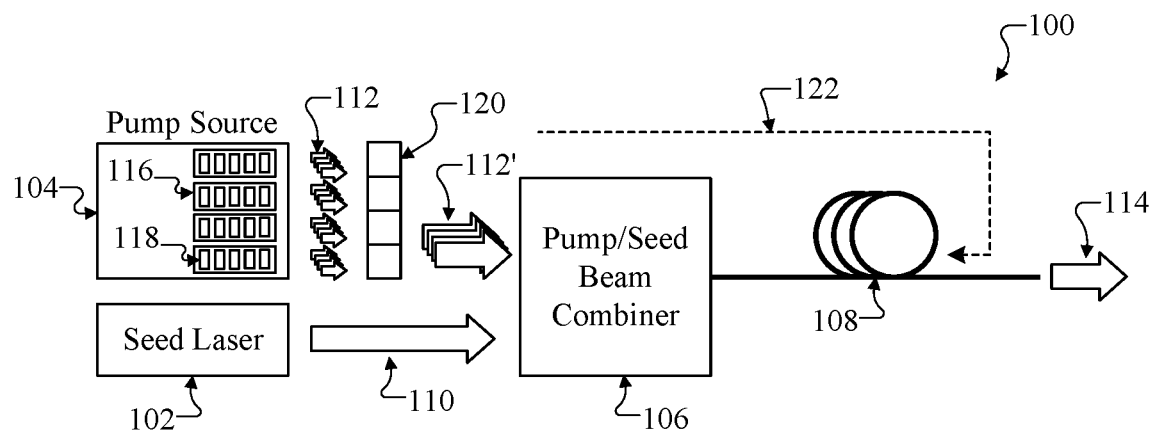
FIG. 1 illustrates an example system for providing Raman amplification with high output power and high beam quality according to this disclosure.

FIGS. 1 through 7, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

As noted above, laser systems that output high-quality beams can be used in a number of applications, including various commercial and defense-related applications. Some laser systems use fiber amplifiers to amplify light, where the light is amplified within optical fibers that are transporting the light. A fiber amplifier often includes a core and at least one cladding around the core, where light travels through the core and is amplified by active lasing ions within the core. Optical pump power provided into the core and an innermost cladding provides the necessary energy for the optical amplification within the core. However, in some circumstances, it is not easy to generate output beams having high power and high beam quality using conventional designs for fiber amplifiers. As a particular example, it may be useful or desirable to design a fiber amplifier that outputs a beam having a wavelength of 1 µm while achieving an output power above 2 to 3 kW. Unfortunately, output powers achievable by many fiber amplifier designs have been limited for years by a nonlinear process called "transverse modal instability" (TMI), which is driven by the inherent thermal load in the basic laser amplification process.

By eliminating stimulated-emission gain of conventional fiber amplifiers in favor of Raman gain, the inherent thermal load can be reduced by a factor of about two, and the TMI threshold can be increased by the same factor. As a result, this can significantly increase the achievable output power from a fiber amplifier. However, successfully transitioning a fiber amplifier to the use of a Raman gain medium comes with a number of design challenges. For example, as described below, optimizing a fiber for Raman amplification limits the ratio of the innermost cladding area to the core area. While conventional circular fiber amplifiers have demonstrated effective stimulated-emission gain using such an area ratio and while those amplifiers can be used to achieve good to marginally good beam qualities at 2 µm to 1.5 µm wavelengths, respectively, those same fiber amplifiers cannot provide acceptable beam qualities at a 1 µm wavelength. Several approaches for using gain filtering to improve the beam quality of 1 µm fiber amplifiers have been demonstrated, but these implementations have been limited to custom fiber geometries with relatively low output powers. Also, while it might be possible to use multiple parallel fiber amplifiers to achieve a higher output power, this increases the size, weight, and power (SWaP) requirements of an overall system and increases the number of required components and the overall complexity of the system. In addition, although high-power 1 µm fiber amplifiers are often pumped by using spatial and polarization combining of a large number of diode pump lasers, those combining techniques may not yield sufficient brightness to enable practical operation with a Raman medium.

This disclosure provides Raman-based amplifiers having design parameters that enable the use of the amplifiers while achieving high output powers and high beam qualities. As described in more detail below, a Raman-based amplifier may include a multi-clad fiber architecture with a substantially circular geometry. The fiber architecture may include a core, a first cladding (commonly called an inner cladding or a pump cladding) around the core, and a second cladding (commonly called an outer cladding) around the first cladding. The core receives a seed beam (commonly called a Stokes seed beam), which is then amplified based on optical pump power, where the optical pump power is received in the core and the first cladding. The second cladding provides a suitable refractive index for proper functioning of the first cladding, as well as increasing the overall mechanical strength of the fiber amplifier. A third cladding may be used around the second cladding and is typically a protective polymer coating or other protective coating.

The fiber architecture can be pumped directly by multiple pumping arrays, and each pumping array may contain multiple semiconductor diode lasers that provide optical pump power. Individual beams of optical pump power from the diode lasers in each array may be spectrally combined to produce multiple combined pump beams, and the combined pump beams may be combined (along with the seed beam) to form a group of co-propagating beams for the fiber architecture. For example, the multiple combined pump beams may be combined and directed into the first cladding and the core of the fiber architecture, while a high-beam-quality seed beam at a Stokes-shifted wavelength can be launched into the core of the fiber architecture. The optical pump power provides sufficient Raman gain within the core of the fiber architecture to achieve efficient transfer of power to the seed beam in order to produce a high-power and high-quality output beam.

Various characteristics or features of the fiber architecture are optimized to increase or maximize the output power and the beam quality that are achievable using the fiber architecture. Among other things, the fiber architecture is based on the natural Raman gain in fused silica, which eliminates dependence on stimulated-emission gain and rare-earth dopants that generate stimulated-emission gain. Also, the diameter of the pump cladding can be significantly reduced, which supports the effective use of Raman gain in the fiber architecture. Moreover, spatial index profiles of the core and the pump cladding can be modified using passive dopants to produce those profiles, and a spatial distribution of Raman gain can be incorporated into the fiber architecture to enable gain filtering. Both of these help to significantly improve the value and robustness of the beam quality produced by the fiber architecture. Further, spectral beam combining in place of spatial beam combining for the pump diode lasers can be supported to help achieve suitable brightness for use with a Raman medium, and the pump cladding's diameter and numerical aperture can be optimized to ensure that the totality of the pump beams is efficiently coupled into the pump cladding. In addition, this approach can reduce the number of components and reduce the SWaP requirements of an overall system at a given power level.

Overall, this disclosure describes various materials, dimensions, and other specifications for a multi-clad fiber architecture that enable this type of design to successfully function as a high-power high-beam quality Raman amplifier. Depending on the implementation, this enables the transition from the use of stimulated-emission gain to the use of Raman gain in a fiber amplifier, which reduces the inherent thermal load in the fiber architecture and raises the TMI threshold and the maximum output power by a factor of about two relative to conventional fiber amplifier designs. In some embodiments, a Raman fiber amplifier is provided that is scalable to high output powers (such as an output power of up to 6 kW to 8 kW or more) while achieving good beam quality (such as a beam quality as measured by $M^2$ of 1.4 or less) and while achieving a high optical efficiency (such as an optical efficiency of at least 70%). Note that, while the various concepts disclosed in this patent document are often described below as involving the use of a Raman medium in the form of an optical fiber, these concepts may also be applicable to other types of Raman media.

Example Raman Amplification System

FIG. 1 illustrates an example system 100 for providing Raman amplification with high output power and high beam quality according to this disclosure. As shown in FIG. 1, the system 100 includes a seed laser 102, a pump source 104, a pump/seed beam combiner 106, and a Raman amplifier 108. The system 100 generally operates to optically amplify a seed beam 110 from the seed laser 102 using multiple pump beams 112 of optical pump power from the pump source 104 to produce an amplified output beam 114. To achieve a practical level of Raman amplification, a wavelength of the seed beam 110 is longer than a median wavelength of the multiple pump beams 112 by a specified amount called the Stokes shift. This Stokes shift is characteristic of a Raman medium in the Raman amplifier 108, which as described below is fused silica (glass). In some embodiments, for instance, the seed beam 110 may have a wavelength of 1 µm to 1.1 µm, and the pump beams 112 may have a median wavelength of 0.95 to 1.05 µm (although these are examples only). The amplified output beam 114 represents an amplified version of the seed beam 110 having a higher optical power relative to the seed beam 110. In some embodiments, the amplified output beam 114 may have an output optical power of 6 kW to 8 kW or even more, although lower output optical powers may also be used.

The seed laser 102 generally operates to produce the seed beam 110, which is amplified during optical amplification by the Raman amplifier 108. For example, the seed beam 110 may represent a lower-power optical signal, such as an optical signal having tens or hundreds of watts of optical power, which is to be optically amplified by the Raman amplifier 108. The seed laser 102 includes any suitable structure configured to generate an optical signal to be amplified. In some embodiments, the seed laser 102 represents a semiconductor laser or other laser configured to produce a beam that is pre-amplified by a low-power fiber amplifier to produce a seed beam 110 having a specified seed power and wavelength (which may be denoted $\lambda_s$). As a particular example, the seed laser 102 may produce a seed beam 110 having a wavelength at or around 1 μm to 1.1 μm.

The pump source 104 generally operates to produce the pump beams 112, which provide optical pump power for use during optical amplification of the seed beam 110 by the Raman amplifier 108. More specifically, the optical pump power provided by the pump beams 112 provides the energy that is used by the Raman amplifier 108 to perform Raman amplification. The pump source 104 includes any suitable structure configured to generate optical pump power. In the illustrated embodiment, the pump source 104 includes multiple modules or arrays 116, and each module or array 116 includes a collection of multiple semiconductor diode lasers 118. The outputs of the individual semiconductor diode lasers 118 in each of the arrays 116 represent the individual pump beams 112, and the individual pump beams 112 from each array 116 may optionally be combined to form combined pump beams 112'. The individual pump beams 112 or the combined pump beams 112' may be directed along with the seed beam 110 into the pump/seed beam combiner 106, which combines these beams and launches this group of beams into the Raman amplifier 108. Each semiconductor diode laser 118 includes any suitable semiconductor structure configured to generate laser energy. Each semiconductor diode laser 118 may be configured to generate laser energy at one of many allowed wavelengths, and each array 116 may include any suitable number of diode lasers 118.

In some embodiments, for each array 116, each diode laser 118 within the array 116 operates at a specified individual wavelength, and the diode lasers 118 in that array 116 produce multiple pump beams 112 that are combined by an associated spectral beam combiner 120. The spectral beam combiner 120 for each array 116 spectrally combines the pump beams 112 from that array 116 to produce an associated combined pump beam 112', which has a resulting median pump wavelength that may be denoted $\lambda_p$. As mentioned above, the wavelengths of the seed beam 110 and the combined pump beams 112' can be specified such that the seed wavelength is shifted to a wavelength that is longer than the median pump wavelength by a single Stokes shift of a fused silica medium in the Raman amplifier 108. Each spectral beam combiner 120 includes any suitable structure configured to spectrally combine multiple input beams having different wavelengths. In some embodiments, each spectral beam combiner 120 may include at least one lens that focuses the input beams onto a diffraction grating, which reflects and combines the input beams.

The pump/seed beam combiner 106 combines the seed beam 110 and the pump beams 112 or 112' and then launches these beams into the Raman amplifier 108. The pump/seed beam combiner 106 thereby operates to combine optical power or energy at different wavelengths to form a higher total power or energy than is contained in any of its individual input beams. Ideally, the pump/seed beam combiner 106 combines the seed beam 110 and the pump beams 112 or 112' while completely or substantially preserving the beam quality of the seed beam 110. The pump/seed beam combiner 106 includes any suitable structure configured to physically combine or group multiple input beams and efficiently launch them into a core and a pump cladding of the Raman amplifier 108.

In some embodiments, the pump/seed beam combiner 106 may include an all-fiber tapered fiber bundle, one specific example of which is disclosed in U.S. Pat. No. 5,864,644 (which is hereby incorporated by reference in its entirety). In this approach, a fiber-based device contains at least one multi-mode fiber having a first end configured to collectively receive the pump beams 112 or 112' and a second end coupled to the Raman amplifier 108 for coupling optical pump power from the pump beams 112 or 112' into the first cladding and the core of the Raman amplifier 108. This fiber-based device also contains a separate single-mode fiber having a first end configured to receive the seed beam 110 and a second end coupled to the Raman amplifier 108 for coupling optical power of the seed beam 110 into the core of the Raman amplifier 108. The at least one multi-mode fiber and the single-mode fiber are bundled together in a region intermediate to the first and second ends, and the bundle is tapered to a reduced cross-sectional region at the second end. The second end can therefore be fusion-spliced or otherwise coupled to the input end of the Raman amplifier 108, thereby conveying the seed into the core and the pump power into the core and first cladding of the Raman amplifier 108. In other embodiments, the pump/seed beam combiner 106 may include a configuration of free-space optics (such as lenses, mirrors, mechanical mounts, etc.).

The Raman amplifier 108 receives the seed beam 110 and the pump beams 112 or 112' as combined by the pump/seed beam combiner 106 and amplifies the seed beam 110 using Raman amplification. The Raman amplifier 108 includes a Raman medium, which amplifies the seed beam 110 based on stimulated Raman scattering (SRS) caused by the optical pump power from the pump beams 112 or 112'. Stimulated Raman scattering transfers power from the pump beams 112 or 112' to the seed beam 110, thereby amplifying the seed beam 110 to produce the amplified output beam 114. As described below, for sufficiently long path lengths in the Raman medium, at least 70% of the pump energy from the pump beams 112 or 112' can be converted to the Stokes wavelength, thereby amplifying the seed beam 110. In a well-designed Raman amplifier 108, the beam quality of the amplified output beam 114 can be the same or substantially the same as the beam quality of the seed beam 110 while being largely independent of the beam quality of the pump beams 112 or 112'. The Raman amplifier 108 includes any suitable structure configured to perform Raman amplification, such as a fiber amplifier. As described in more detail below, the Raman amplifier 108 may be formed using fused silica, at least some of which may be doped.

The output of the Raman amplifier 108 is the amplified output beam 114, which represents an amplified version of the seed beam 110. The Raman amplifier 108 can be designed in accordance with the teachings below in order to increase or maximize the output power and the beam quality of the output beam 114 (relative to beams produced using conventional Raman amplifiers). For example, the Raman amplifier 108 can be implemented using a multi-clad fiber architecture having a substantially circular geometry, which can include a core, a first cladding around the core, a second cladding around the first cladding, and possibly a third cladding around the second cladding. The core represents the portion of the Raman-medium cross-section into which the seed beam 110 is launched and in which the seed beam 110 is amplified based on the pump beams 112 or 112' received by the core and the first cladding.

Various characteristics or features of the Raman amplifier 108 (such as materials, dimensions, and other specifications) can be designed as described below to increase or maximize the output power and the beam quality of the output beam 114. In some embodiments, the Raman amplifier 108 can be used to provide an amplified output beam 114 having an output power of up to 6 kW to 8 kW or more, a beam quality (as measured by $M^2$) of 1.4 or less (where lower values indicate better beam qualities), and an optical efficiency of at least 70%. The discussion below describes how the Raman amplifier 108 and the pump source 104 can be designed to be fully compatible with each other and how the Raman amplifier 108 can be designed to meet various requirements for efficient execution of its Raman amplification function.

Although FIG. 1 illustrates one example of a system 100 for providing Raman amplification with high output power and high beam quality, various changes may be made to FIG. 1. For example, the pump source 104 may include any suitable number of arrays 116, and each array 116 may include any suitable number of semiconductor diode lasers 118. Also, the layout and arrangement of components in FIG. 1 are for illustration only and can vary as needed or desired. As a particular example, the seed laser 102 and/or the pump source 104 may be located remote from the pump/seed beam combiner 106 and may provide the seed beam 110 and/or the pump beams 112 or 112' indirectly to the pump/seed beam combiner 106. Similarly, the pump/seed beam combiner 106 may be located remote from the Raman amplifier 108 and may provide the combined seed beam 110/pump beams 112 or 112' indirectly to the Raman amplifier 108. In addition, the amplified output beam 114 may be used in any suitable manner, which can vary widely based on the specific application.

Example Raman Amplifier

Figure 2A:
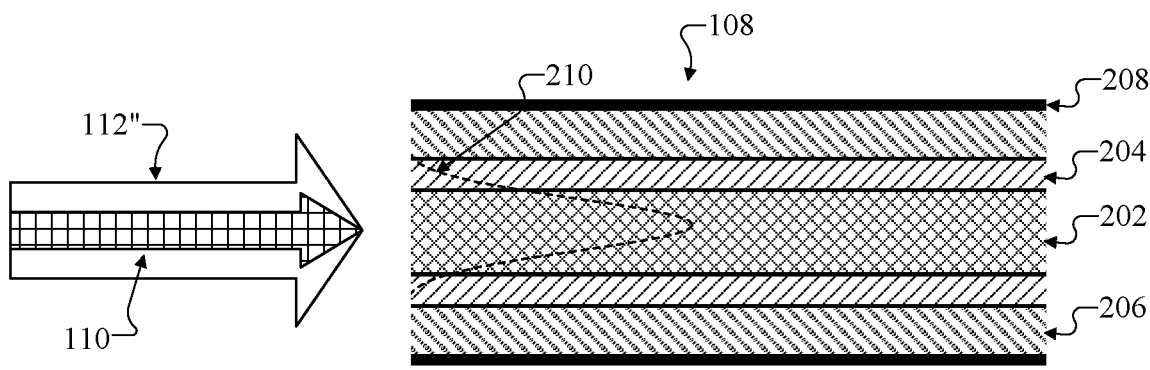
FIGS. 2A and 2B illustrate longitudinal and transverse cross-sections, respectively, of an example Raman amplifier supporting high output power and high beam quality according to this disclosure.
Figure 2B:
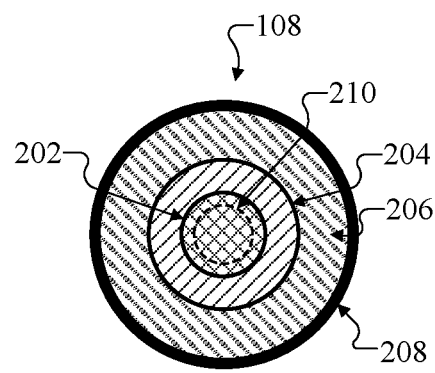

FIGS. 2A and 2B illustrate longitudinal and transverse cross-sections, respectively, of an example Raman amplifier 108 supporting high output power and high beam quality according to this disclosure. In particular, FIG. 2A illustrates a longitudinal cross-section of the Raman amplifier 108 taken along the length of the Raman amplifier 108, meaning in a plane extending along a longitudinal axis of the Raman amplifier 108. FIG. 2B illustrates a transverse cross-section of the Raman amplifier 108 taken across the width of the Raman amplifier 108, meaning in a plane perpendicular to the longitudinal axis of the Raman amplifier 108. For ease of explanation, the Raman amplifier 108 may be described as being used in the system 100 of FIG. 1. However, the Raman amplifier 108 may be used in any other suitable system.

As shown in FIGS. 2A and 2B, the Raman amplifier 108 in this particular example is implemented in the form of a fiber amplifier. Here, the fiber architecture includes a core 202, a first cladding 204, a second cladding 206, and a third cladding 208. The core 202 generally has the shape of a cylinder within the Raman amplifier 108. Thus, the core 202 has a generally rectangular cross-sectional shape in FIG. 2A and a substantially circular cross-sectional shape in FIG. 2B.

The core 202 receives most or all of the seed beam 110 and amplifies the seed beam 110 using Raman amplification. The core 202 has a first index of refraction. In some embodiments, the core 202 is formed using fused silica with a suitable doping to achieve the desired first index of refraction. In particular embodiments, the core 202 is formed using fused silica that is doped with germanium (Ge) to increase the Raman gain and/or alter the refractive index.

The first cladding 204 is positioned around the core 202. The first cladding 204 generally has the shape of an annular cylinder within the Raman amplifier 108. Thus, the first cladding 204 is positioned above and below the core 202 in FIG. 2A and has an annular shape surrounding the core 202 in FIG. 2B. An input pump beam 112" (which represents the combined pump beams 112' from the arrays 116 in the pump source 104) is received in the core 202 and the first cladding 204, and it provides the power needed for Raman amplification in the core 202. The first cladding 204 has a second index of refraction that differs from the first index of refraction, such as when the second index of refraction is lower than the first index of refraction. The difference between the first and second indices of refraction helps to substantially confine a fundamental mode of the seed beam 110 within the core 202 of the Raman amplifier 108, such as via total internal reflection. However, the difference between the first and second indices of refraction can be small enough so that higher-order modes of the seed beam 110 can exit the core 202. In some embodiments, the first cladding 204 is formed using fused silica with a suitable doping, such as aluminum (Al), to achieve the desired second index of refraction.

The second cladding 206 is positioned around the first cladding 204. The second cladding 206 generally has the shape of an annular cylinder within the Raman amplifier 108. Thus, the second cladding 206 is positioned above and below the first cladding 204 in FIG. 2A and has an annular shape surrounding the first cladding 204 in FIG. 2B. The second cladding 206 has a third index of refraction that differs from the first and second indices of refraction, such as when the third index of refraction is lower than the first and second indices of refraction. The difference between the second and third indices of refraction helps to substantially confine the optical pump power of the pump beam 112" within the core 202 and the first cladding 204 of the Raman amplifier 108, such as via total internal reflection. In some embodiments, the second cladding 206 is formed using fused silica, with or without a suitable doping to achieve the desired third index of refraction. In some cases, the second cladding 206 may be doped (such as with fluorine) to reduce the third index of refraction.

The third cladding 208 is typically placed or formed around the second cladding 206 and functions as a protective coating for the Raman amplifier 108. For example, the third cladding 208 may represent a polymer coating placed on the outer surface of the second cladding 206. Note, however, that the third cladding 208 may be formed from any suitable protective material and in any suitable manner.

As can be seen in FIG. 2A, the seed beam 110 and the pump beam 112" spatially overlap as they are directed or launched into the Raman amplifier 108. This spatial overlapping may be achieved using the pump/seed beam combiner 106 or in any other suitable manner, such as by using optical or fiber mechanisms. Since the beam quality of the amplified output beam 114 is limited by that of the seed beam 110, the seed beam 110 may be designed to be nearly diffraction-limited, and the core 202 can be designed to maintain that beam quality. For example, the core 202 may have a diameter of 20 µm to 25 µm and a numerical aperture (NA) of 0.06 or less. If the Raman amplifier 108 is implemented as a fiber and is coiled with a coil diameter of 10 centimeters to 15 centimeters, the higher-order core modes can be effectively stripped from the core 202. This leaves most of the signal power in the fundamental core mode. In this example, a spatial profile of the diffraction-limited fundamental core mode is schematically represented by a curve 210 overlapping the core 202 in FIG. 2A.

Since this design is aimed at higher output power levels, the pump beam 112" may necessarily be multi-mode, so the pump beam 112" is provided into the first cladding 204 as well as the core 202. Due to the fact that stimulated Raman scattering is a relatively weak nonlinear process in fused silica, the intensity of the pump beam 112" may need to be as high as possible, so the size of the first cladding 204 may be made as small as possible while still being large enough to capture the entirety of the pump beam 112".

Various characteristics of the Raman amplifier 108 are quantified below. Before that, the following introduces a common approach for characterizing the size and divergence of an optical beam, such as the pump beam 112". The "beam parameter product" (BPP) of a beam can be defined as the product of (i) the beam diameter of the beam, and (ii) the full-angle beam divergence of the beam. The BPP of the pump beam 112" can be compared with the special case of a diffraction-limited beam. For example, a diffraction-limited Gaussian beam at a wavelength of 1 µm has a BPP of about 1.35 mm·mrad (millimeters times milliradians), while a diffraction-limited "top hat" beam at a wavelength of 1 µm has a BPP of about 1.85 mm·mrad. The pump beam 112" can be efficiently launched into the Raman amplifier 108 if the Raman amplifier 108 contains a first cladding 204 having a diameter and numerical aperture that yield a BPP exceeding the BPP of the pump beam 112". The second cladding 206 can possess a suitable index of refraction relative to the first cladding 204 in order to provide the desired numerical aperture for the first cladding 204. The second cladding 206 in the transverse dimension (along the length of the fiber) also provides mechanical strength so the fiber can achieve an acceptable operational lifespan. Additional characteristics of the Raman amplifier 108 are provided below.

Although FIGS. 2A and 2B illustrate longitudinal and transverse cross-sections, respectively, of one example of a Raman amplifier 108 supporting high output power and high beam quality, various changes may be made to FIGS. 2A and 2B. For example, FIGS. 2A and 2B are not drawn to scale, and the relative thicknesses of the core 202 and claddings 204-208 may vary as needed or desired.

Example Design Characteristics

The following now identifies various design challenges associated with Raman fiber amplifiers and provides a discussion of design characteristics for the Raman amplifier 108, which address these design challenges and meet the objectives described above. Again, the objectives here include designing a Raman amplifier 108 that can achieve an output power of up to 6 kW to 8 kW or more, an $M^2$ beam quality of 1.4 or less, and an optical efficiency of at least 70%.

Cladding-to-Mode Area Ratio (CMAR)

The ratio of the cross-sectional area of the first cladding 204 to the cross-sectional area of the fundamental mode of the core 202 (which is the preferred operational core mode) defines a cladding-to-mode area ratio (CMAR). The cross-section here is taken across the width of the amplifier 108. The CMAR cannot exceed some upper limit if one wishes to have a single Stokes wavelength shift in the output wavelength of the output beam 114 relative to the pump wavelength of the pump beam 112". This limit is derived from the recognition that the product gIL of the Raman gain coefficient g, the pump intensity I, and the length of the fiber L needs to have some specific value (typically about 8 to about 10) in the Raman amplifier 108 to yield practical power conversion from the pump beam 112" to the seed beam 110. However, once the first Stokes-shifted beam in the core 202 begins to increase in power, the first Stokes-shifted beam may actually begin to generate a second Stokes-shifted beam in the core 202 at another wavelength that is two Stokes shifts longer than the pump wavelength. This can be due to the smaller cross-sectional area of the core 202, which increases the intensity and the corresponding gIL product in the core 202 relative to what they would have been had they occurred in the first cladding 204.

As an example of this, assume the initial gIL value for a fiber amplifier is 10. Assuming the power of the first Stokes-shifted beam has reached 50% of the original pump power and the CMAR is 10, the gIL product within the core 202 for the first Stokes-shifted beam would be 10×0.5× 10=50. This value is high enough that the first Stokes-shifted beam produced in the core 202 can begin to generate a second Stokes-shifted beam in the core 202, which is initiated by weak spontaneous Raman scattering induced by the first Stokes-shifted beam. If this occurs, a significant fraction of the first Stokes-shifted beam can be shifted to the longer wavelength of the second Stokes-shifted beam. For even higher CMAR values, ever longer multi-Stokes-shifted wavelengths can be produced. While this might be welcome in some Raman-based laser applications, that is not the case where an objective is to produce the highest possible output power at a single output wavelength.

In light of this, the Raman amplifier 108 is designed to have a CMAR that limits the Raman amplifier 108 to a single Stokes-shifted wavelength generation for a given core mode diameter and area. This establishes an upper limit to the area of the first cladding 204, which affects other design degrees of freedom as discussed below. In some embodiments, the Raman amplifier 108 can be designed to have a CMAR that is limited in value to between two to three or between two to four. As a particular example, if the core 202 has a diameter of 20 µm, the first cladding 204 may have a diameter of 35 µm. As another particular example, if the core 202 has a diameter of 25 µm, the first cladding 204 may have a diameter of 45 µm. In some cases, the second cladding 206 may have a significantly larger diameter compared to the first cladding 204, such as a diameter of about 250 µm.

Pump Cladding BPP

As discussed above, the first cladding 204 needs to be designed to accommodate the BPP value of the pump beam 112". Moreover, the pump cladding area (which is directly related to the diameter of the first cladding 204) is subject to the CMAR limit described above in order to avoid multiple Stokes shifts in the core 202. Therefore, the numerical aperture of the interface between the first cladding 204 and the second cladding 206 is the only remaining design parameter that can be specified to ensure that the first cladding 204 has a sufficiently large angular acceptance and is otherwise able to accommodate the pump beam 112".

In light of this, it is useful to estimate a realistic value for the angular acceptance of the first cladding 204 and the allowable BPP of the pump beam 112". In some embodiments, the first cladding 204 of the Raman amplifier 108 can be designed to have a numerical aperture of 0.17 (roughly corresponding to a full angle of 340 mrad). Given this numerical aperture, the tolerable BPP of a first cladding 204 having a diameter of 45 μm is about 15 mm·mrad, or approximately eight to ten times diffraction-limited for an optical wavelength of 1 Since the BPP of the pump beam 112" will scale with total pump power, this final BPP of the first cladding 204 represents a hard limit on the allowable maximum pump power to be received by the Raman amplifier 108. Note that the actual BPP to be used may be somewhat uncertain at this point, since there is some uncertainty in defining the parameters as indicated above. Thus, the final BPP of the first cladding 204 represents a hard limit, but exactly what the limit is may remain quantitatively uncertain at this point and may be further refined based on additional design decisions.

Pump Bandwidth

A practical approach for scaling the power of a pump source 104 that uses multiple semiconductor diode lasers 118 is to use spectral beam combining to enable an increase in the total number of diode lasers 118. However, the use of spectral beam combining involves expanding the overall bandwidth range (or spread) of the diode lasers 118, so it may be necessary to determine just how wide of a spectral bandwidth can be tolerated by the Raman amplifier 108. The Raman gain of fused silica is fairly broad, having a full width at half maximum (FWHM) value of about 7 THz. Having said that, when used as an amplifier, the effective Raman gain of fused silica is narrowed by approximately the square-root of the small-signal gain. Thus, a notional Raman gain (the gIL product) of about ten will reduce the effective gain bandwidth of a Raman amplifier by a factor of about three to a lower bandwidth of about 2 THz. This corresponds to a bandwidth of about 7 nm in the 1 μm spectral range.

In light of this, to be conservative, the total allowable bandwidth of the diode lasers 118 in the pump source 104 may be limited to a somewhat lower value. In some embodiments, the total allowable bandwidth of the diode lasers 118 in the pump source 104 may be limited to a value such as 5 nm. In these embodiments, the pump source 104 may produce the needed optical pump power within an overall bandwidth that is fully compatible with a Raman gain bandwidth of 5 nm. This helps to ensure that the diode lasers 118 passively operate to help amplify a single Stokes seed beam 110, which may have a much narrower bandwidth than any of the combined pump beams 112'.

Pump Diodes

Some diode-pumped Raman fiber lasers have been shown to accommodate a range of widely-spaced pump wavelengths separated by as much as 60 nm. However, these demonstrations report a correspondingly broad output spectrum in their output beams, which may not be suitable for use in subsequent spectral or coherent beam combining architectures or in specific applications requiring narrow output bandwidths. This broad output spectrum illustrates a problem that arises if the total pump power exceeds the Raman bandwidth, namely that various spectral regions can undergo Raman conversion independently of other spectral regions. If not properly designed, this can yield a number of widely-spaced output wavelengths covering an overall spectral bandwidth that is too broad to be compatible with certain applications.

Various attempts have been made to spectrally combine the outputs of multiple pump diodes, often in the context of industrial laser processing applications. While the power-scaling potential of these approaches is generally acceptable to the present Raman amplifier design, the beam qualities obtained using these approaches are not acceptable, and therefore these approaches are not compatible with the upper CMAR limit described above. In addition, these approaches typically have a total spectral bandwidth of about 20 nm, which greatly exceeds the bandwidth limits of the Raman gain process in silica fibers as discussed above.

Although disappointing, this is understandable in the context of the intended applications. It is typically difficult to maintain good laser beam quality as the laser power increases. Also, industrial laser processing applications often prefer to have a beam divergence that is many times larger than the diffraction limit. Diffraction-limited beams can be focused down to very small spot sizes that can be very intense. However, this intensity can be so high that, rather than achieving the desired materials processing objective (such as cutting, welding, or drilling through a metal or other material), the laser beam initiates the formation of a plasma just above a work piece, which can reflect the incoming laser beam and is therefore highly undesirable in industrial laser processing applications.

In the context of this disclosure, this situation means that it is unlikely to find off-the-shelf spectral beam combining diode systems that are directly applicable to pumping a Raman amplifier. As a result, in some embodiments, a custom diode laser and spectral beam combination package can be provided as described below to achieve the desired beam quality while supporting a narrow total spectral bandwidth (such as a bandwidth of 5 nm).

In light of this, in order to generate a pump beam 112" having a desired narrow bandwidth, the pump source 104 can be implemented using multiple arrays 116 of diode lasers 118. Each array 116 produces a combined pump beam 112' having a specified amount of optical pump power, such as 2 kW. Each array 116 can also produce a combined pump beam 112' having a specified bandwidth, such as 5 nm, and a specified BPP of about twice diffraction-limited. For present purposes, this is preferred to having a single array of diode lasers 118 that produces a higher output power at a much larger bandwidth and BPP.

The number of arrays 116 used in the pump source 104 can vary based on the desired amount of optical pump power provided by the pump beam 112". As an example, for a nominal total pump power of 8 kW, four arrays 116 of diode lasers 118 may be used, with the four arrays packaged together in a 2×2 arrangement, where each array 116 produces 2 kW of optical pump power. Assuming the combined pump beams 112' from the arrays 116 have worst-case "top-hat" beam intensity profiles (each with a BPP of 1.85 mm·mrad) and each of the arrays 116 is about twice diffraction-limited for a BPP of 3.7 mm·mrad, a 2×2 arrangement of arrays 116 would have a BPP of less than 8 mm·mrad in each transverse dimension. For comparison, the BPP of a pump cladding having a 45 μm diameter and a 0.17 numerical aperture would be about 15 mm·mrad, which exceeds the BPP of the pump beam 112" by nearly a factor of two and allows significant tolerance on the actual BPP of each array 116. In particular embodiments, the combined pump beam 112' produced by each array 116 may have an optical power of 2 kW, a bandwidth of 5 nm, an $M^2$ beam quality of 2.0, and a generally elliptical beam shape. As a side note, this combination of performance parameters generally corresponds to a higher brightness and a smaller beam size than is achieved by typical pump diode assemblies for a high-power ytterbium (Yb) fiber laser.

The possibility of generating a narrowband Raman-shifted output beam 114 determines which applications might benefit from the higher-power capability of the Raman amplifier 108. For example, the fact that the Raman amplifier 108 produces a single high-power output beam 114 with a relatively narrow bandwidth may enable its use in advanced high-energy laser (HEL) systems in which very high power levels are achieved by combining a large number of fiber-laser unit cells. As a particular example, each unit cell may produce a specified amount of useful output power, and outputs from multiple unit cells may be combined (such as via spectral or coherent beam combining) to achieve higher output powers. Both spectral and coherent beam combining may require that each unit cell produce a fairly narrow spectral bandwidth. By using the Raman amplifier design approaches described here, each unit cell may achieve a higher output power level (such as 6 kW to 8 kW) while still having an output bandwidth compatible with such high-power beam-combining architectures. Thus, the approaches described here may allow fewer unit cells to be used in a given HEL architecture or allow higher output power levels to be achieved in a given HEL architecture.

Stokes Beam Mode Control

In examples above, notional diameters of 20 or 25 μm and 35 or 45 μm are provided for the core 202 and the first cladding 204, respectively. Each of these two concentric cylindrical structures can support multiple optical modes, but it may not be evident whether those structures will necessarily control the optical modes adequately to produce a high-quality output beam 114. The respective numerical apertures of the core 202 and the first cladding 204 can be specified to resolve this issue, since the core's numerical aperture determines how strongly the fundamental core mode is contained within the core 202, and the first cladding's numerical aperture determines how strongly the optical pump power is contained within the first cladding 204. In creating a successful design, it should also be recognized that the proximity of the first cladding 204 may change the shape and divergence of the optical modes in the core 202. Thus, an optical mode that ideally is the fundamental mode of an isolated core 202 might actually extend out of the core 202 into the first cladding 204 with a higher divergence. In view of these and other possibilities, it is appropriate to discuss various challenges regarding mode control. This discussion is considered in the context of two separate strategies, namely (i) control of the geometry and numerical aperture and (ii) spatial control of the gain and loss (often referred to as gain- and loss-filtering).

With respect to geometry and numerical aperture control, various designs for multi-clad fiber architectures have been developed that can operate well at longer wavelengths (such as a 2 μm wavelength), but they perform poorly at shorter wavelengths (such as a 1 μm wavelength). This is because, for a given physical waveguide structure, the number of higher-order modes supported by the core and pump cladding increases as the operating wavelength decreases. The higher-order modes degrade the beam quality unless some effective mechanism for higher-order mode suppression is incorporated. Decreasing the core diameter and increasing the pump cladding diameter tends to reduce the coupling of the core and pump cladding modes, which improves the beam quality. However, the resulting CMAR from this modification can violate the upper CMAR limit discussed above, and it still may not provide adequate results at wavelengths around 1 μm.

Other multi-clad fiber architectures may support smaller numerical apertures between the core and pump cladding and between the pump and outer claddings. Unfortunately, because of these small numerical apertures, the common mode discrimination technique of simply coiling a fiber is ineffective. In some prior approaches, a ring of depressed refractive index material inserted immediately adjacent to the outer boundary of the core may restore bend-induced mode discrimination, but this may require a large pump cladding diameter, which can violate the upper CMAR limit discussed above. While inserting a ring of depressed refractive index material immediately adjacent to the outer boundary of the pump cladding (rather than the core) might be used, this can result in unacceptable beam qualities.

With respect to gain- and loss-filtering, gain filtering can be achieved by localizing the gain in a fiber amplifier to a portion of the core's cross-section, and this localization can quite effectively favor the fundamental spatial mode at the expense of higher-order modes. Germanium can be used as a dopant to increase the Raman gain in silica fibers. However, in the past, germanium doping has been used in both the core and the pump cladding of a Raman amplifier, where slightly different doping levels are used to produce the desired index profile of the core and the pump cladding. Because of the small differences in the index values, and hence the small differences in the germanium concentrations in the core and the pump cladding, the Raman gain of such a design is essentially uniform across the entire core/pump cladding structure. This precludes any possibility of gain filtering and opens the risk of not having sufficient control over the final modal content of a Raman-shifted output beam, thereby yielding an output beam having a quite poor beam quality. Aluminum can also be used as a dopant to raise the refractive index of a fiber feature relative to that of silica. Replacing germanium with aluminum as a pump cladding dopant may allow one to obtain the same overall index profile. While a germanium-doped core would also offer the capability of increasing the Raman gain and this extra design degree of freedom opens the possibility of mode control with gain filtering, such is not the case with an aluminum-doped pump cladding.

In some embodiments, a baseline design of the Raman amplifier 108 may have (i) a core 202 with a diameter of 20 to 25 μm and a numerical aperture of 0.06 or less and (ii) a first cladding 204 with a diameter of about 35 to 45 μm and a numerical aperture of 0.17 or less. Meeting these specifications may involve the use of a specific refractive index profile. Assuming the second cladding 206 is pure fused silica, the first cladding 204 may have a refractive index increment of 0.010 relative to pure silica to produce the numerical aperture of 0.17, and the core 202 may have an additional refractive index increment of 0.0012 to produce the numerical aperture of 0.06 relative to the first cladding 204. The final index of the core 202 relative to pure silica can be 0.0112, which may be achieved with a germanium doping of about 8% of the fused silica in the core 202. This germanium doping also increases the Raman gain of the core 202 by a factor of about 1.6, which enables significant gain filtering in favor of the fundamental mode. Doping the first cladding 204 with germanium would neutralize the gain-filtering benefit. Rather than doing that, the first cladding 204 can be doped with aluminum, which is capable of achieving the 0.17 numerical aperture without changing the Raman gain relative to fused silica.

Figure 3:
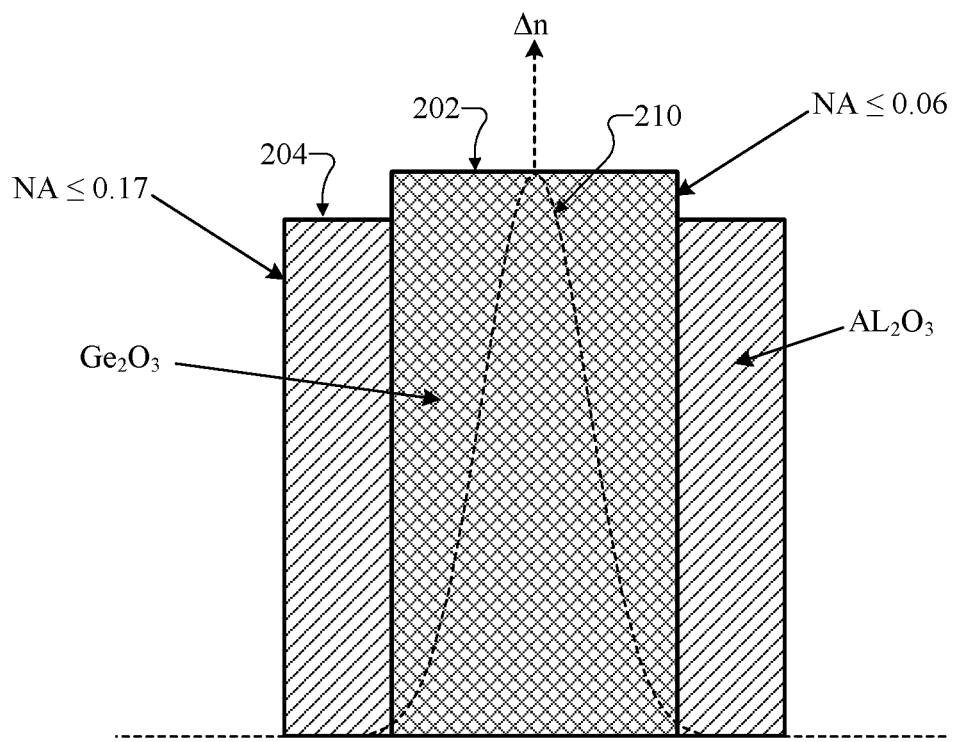
FIG. 3 illustrates an example numerical aperture profile, doping strategy, and other example features for a Raman amplifier supporting high output power and high beam quality according to this disclosure.

FIG. 3 illustrates an example numerical aperture profile, doping strategy, and other example features for a Raman amplifier 108 supporting high output power and high beam quality according to this disclosure. In this particular example, the core 202 is doped with germanium to form germanium sesquioxide ($Ge_2O_3$), while the cladding 204 is doped with aluminum to form aluminum oxide ($Al_2O_3$). The vertical heights of the core 202 and cladding 204 in FIG. 3 represent refractive-index changes (Δn) in the core 202 and cladding 204 relative to pure fused silica. The curve 210 is shown again in FIG. 3, where it schematically represents the spatial profile of the fundamental mode of the core 202. As can be seen here, this preferred mode has significant overlap with the germanium-doped core 202, whereas higher-order modes will have less overlap with the core and significant amplitudes in the first cladding 204, and therefore have less gain. As can be seen here, the core 202 has a larger index change relative to pure fused silica compared to the cladding 204, which is expected, given the design parameters discussed above.

Note that it may also be possible to use both germanium and aluminum doping in separate cylindrical portions of the cross-section of the core 202. In some embodiments, a cylindrical inner portion of the core 202 may have germanium doping, while the remaining portion of the core outside of the germanium doping may have aluminum doping. In that case, the germanium helps to increase the Raman gain of the core 202 as desired, and the aluminum helps to achieve the desired refractive index and numerical aperture of the core 202 without increasing the Raman gain. In those embodiments, the overall refractive index profile is unchanged, but the fraction of the core 202 having enhanced Raman gain has been reduced somewhat. This can help to provide significant design flexibility for fine tuning of the Raman gain of the core 202 and the numerical aperture values of the core 202 and cladding 204, as well as providing for improved mode discrimination through the use of gain filtering.

As a complement to gain filtering (which favors the desired fundamental mode by providing it with the highest gain), the same or similar objective can be achieved by employing loss filtering (which causes higher-order modes to have greater losses than the fundamental mode). In an approach for implementing loss filtering, samarium (Sm) might be used to provide optical loss for higher-order modes in a fiber amplifier in which the active ion is neodymium (Nd), since samarium is a very strong absorber around 1.06 µm (the typical wavelength of a Nd laser). Because of this strong absorption, the samarium-doped regions would not be located in direct contact with the core (where the samarium would increase the loss within the core), but rather in a ring structure that resides within the pump cladding without any direct interface with the core. However, this localized loss would complicate mode competition within the core/pump cladding volume, and it would not be particularly effective as a loss-filtering mechanism. In another approach, scattering centers can be distributed throughout the second cladding 206 of a fiber amplifier and used to attenuate stray beams propagating in the outer cladding by increasing the light-scattering losses. The outer diameter of the second cladding 206 can then be varied along the fiber length so that the second cladding 206 expands and contracts relative to the core 202 along the fiber length to spatially mix the stray beams to enhance the light-scattering losses. However, the resulting attenuation is achieved outside of the pump cladding, which does not help with attenuation inside the pump cladding (where the higher-order modes reside).

Figure 4:
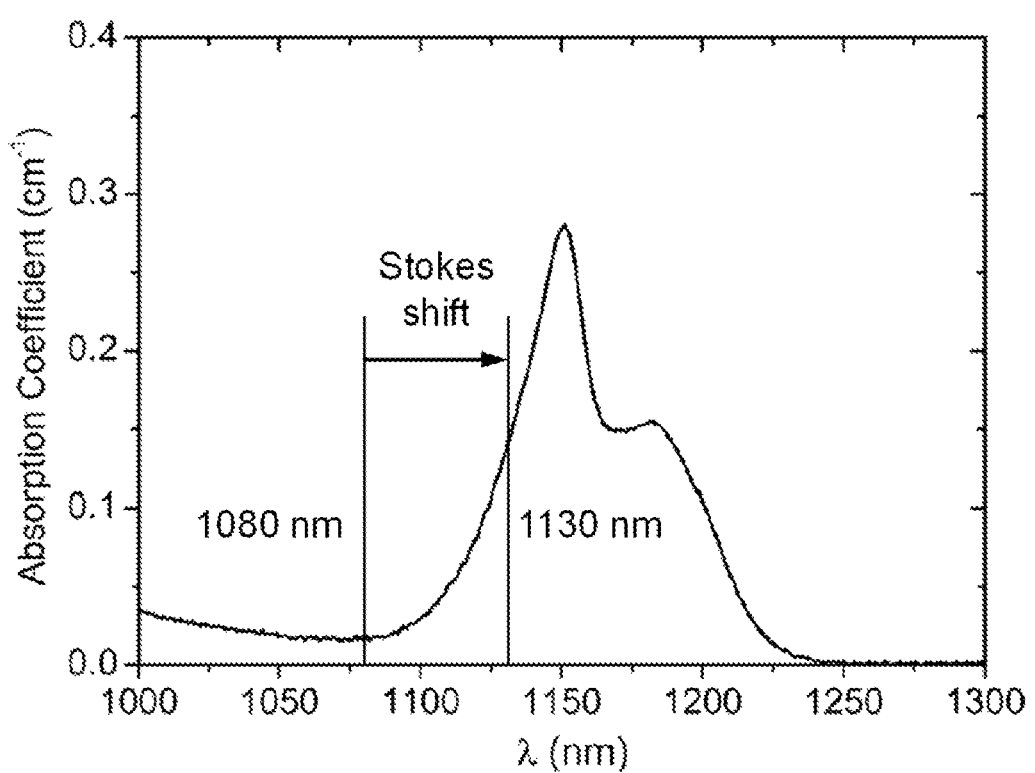
FIG. 4 illustrates an example absorption profile produced in a pump cladding of a Raman amplifier according to this disclosure.

A more viable method of loss filtering may be implemented specifically in the Raman amplifier 108. Various prior loss-generation techniques are not viable here for the reasons discussed above. Instead, some material, such as a rare-earth or transmission-metal element having an atomic absorption wavelength at or near the Stokes wavelength and essentially no absorption at the pump wavelength, can be used. One possibility of such a material is holmium (Ho). FIG. 4 illustrates an example absorption profile produced in a pump cladding 204 of a Raman amplifier 108 according to this disclosure. More specifically, FIG. 4 illustrates the absorption coefficient of holmium as function of wavelength near 1 µm. It can be seen here that holmium has a peak absorption near 1150 nm, with a gradual decrease in the absorption for shorter wavelengths.

FIG. 4 also identifies a wavelength of 1080 nm that might be used as a pump wavelength of the pump beam 112" for the Raman amplifier 108, as well as a Stokes-shifted signal wavelength at 1130 nm. As can be seen in FIG. 4, doping holmium into the first cladding 204 has negligible impact on the 1080 nm pump beam 112", because the holmium absorption is very weak at that wavelength, meaning the pump beam 112" remains substantially unaffected. Holmium does cause absorption at the Stokes wavelength. However, since the mode amplitudes are greater for higher-order core/pump cladding modes than for the fundamental mode that mostly resides within the core 202, the holmium introduces a higher loss for the higher-order modes compared to the fundamental core mode. In particular embodiments, for instance, the first cladding 204 may be formed using Ho'-doped aluminosilicate fiber (meaning the aluminosilicate fiber is doped with Ho' ions). Obviously, this particular absorption is satisfactory for these specific pump and Stokes wavelengths to yield the appropriate spatially varying, wavelength-dependent loss values. This type of loss filtering may not be viable in applications where, for example, a wide range of output wavelengths is needed or desired. This type of loss filtering is certainly beneficial for applications having a relatively small wavelength spread, particularly if other absorbers having spectral properties similar to those of holmium with large differences in absorption for potential pump and Stokes wavelengths are used and doped into silica fibers.

Overall, the novel core/pump cladding design described above can incorporate suitable gain- and loss-filtering. This design provides an effective mechanism for consistently producing a nearly diffraction-limited 1 µm output beam or other output beam from a high-power Raman amplifier 108 while satisfying various mode-control requirements. Note, however, that gain-filtering and loss-filtering need not both be implemented in a single Raman amplifier 108, and the Raman amplifier 108 may include either gain-filtering or loss-filtering (but not both).

Suppressing Stimulated Brillouin Scattering (SBS)

One common challenge shared by applications involving the transmission of high-power laser beams through optical fibers and other media is the suppression of stimulated Brillouin scattering (SBS). Stimulated Brillouin scattering is a competing nonlinear process to stimulated Raman scattering, and stimulated Brillouin scattering arises when the intensity of an optical beam exceeds a threshold level that depends on the physical properties of the transmission medium and the optical beam.

Stimulated Brillouin scattering can be suppressed by taking advantage of the fact that the spectral bandwidth of the SBS process is relatively narrow, typically several tens of megahertz in fused silica fibers, depending on the wavelength of the optical beam. In the frequency domain, stimulated Brillouin scattering for a given total signal power can be suppressed by using a phase- or frequency-modulation technique to broaden the bandwidth of the desired optical signal such that only a small fraction of the signal power that resides within the SBS bandwidth must be below the SBS threshold. As the signal power increases, it is often the case that just increasing the spectral bandwidth of the signal is sufficient to suppress stimulated Brillouin scattering, but this may not be possible in some applications. For example, it may be that some other aspects of a laser system or application might establish a practical upper limit to the signal bandwidth and thereby form a limit to the SBS-free signal power. Moreover, bandwidth modulation may have inherent limits, such as where some modulation techniques simulate a uniformly-broad spectral bandwidth by operating at a single frequency, but sweeping that frequency (at a fast sweep rate) across a total spectral range comparable to or larger than the SBS bandwidth. In some cases, this sweep is done in a stochastic manner, but such a stochastic modulation approach can actually allow a relatively narrow bandwidth to exist for a time that exceeds the SBS turn-on time, in which case stimulated Brillouin scattering can still occur. In other embodiments, it is possible to apply a constant set of fixed, simultaneous, modulation frequencies to a signal such that the signal and the additional modulation frequencies produced by the interference of the signals are effective in suppressing stimulated Brillouin scattering. These modulations can occur continuously during the operational time of a laser and can therefore suppress stimulated Brillouin scattering in a constant deterministic manner.

In the time domain, the SBS spectral bandwidth translates into a turn-on time $\tau_b$, which in some cases may typically be around 100 ns. For a pulsed-signal waveform having a pulse length $\tau_s$, as the ratio $\tau_s/\tau_b$ decreases below unity, the SBS process moves into a transient regime in which the effective growth rate of the stimulated Brillouin scattering decreases and the SBS threshold power increases. This can be exploited to suppress stimulated Brillouin scattering quite effectively, such as by operating a seed beam 110 using a nanosecond pulse regime.

In still other embodiments, modulation of the pump beam 112" (rather than modulation of the seed beam 110) may be used to suppress stimulated Brillouin scattering. In this case, the pump beam 112" can be launched into the Raman amplifier 108 such that it propagates in a direction opposite to the seed beam 110 in the amplifier 108 and parallel to any backward-propagating SBS beam that an amplified seed signal might generate. This alternate path for the pump beam 112" can be created in FIG. 1 by having the pump beams 112' (or the pump beam 112") follow a path 122 (counter-propagating to the seed beam 110) represented by a dashed line in FIG. 1. In this case, the pump beam 112" and any SBS beam are co-propagating, and the intensity modulation of the pump beam 112" can modulate and broaden the bandwidth of the SBS beam. For a sufficient magnitude of the intensity fluctuation, this modulation can spectrally broaden the SBS beam to the point that it exceeds the SBS bandwidth, at which point the SBS growth is terminated. This approach can exploit the earlier principle of producing a process that suppresses stimulated Brillouin scattering by forcing the process to exceed the SBS bandwidth, but it does so without the requirement for modulation of the seed beam 110.

In light of this, any of these SBS suppression techniques or other SBS suppression techniques may be used in the Raman amplifier 108 to suppress stimulated Brillouin scattering that might occur in the Raman amplifier 108.

Suppressing Pump-Modulation Transfer to Raman Signal

Some applications of the Raman amplifier 108 may require an output signal having a very narrow spectral bandwidth. One challenge of this type of situation is the fact that strong, undesired temporal fluctuations that might be present on the intensity of the pump beam 112" can modulate the frequency of the seed beam 110, such as through the optical Kerr effect. In view of this, in order to prevent such a modulation in the Raman amplifier 108, a counter-pumping approach can be used where the pump beam 112" and the seed beam 110 are launched into opposite ends of the Raman amplifier 108. Again, this alternate path for the pump beam 112" can be created in FIG. 1 by having the pump beams 112' (or the pump beam 112") follow the path 122 represented by the dashed line in FIG. 1. This arrangement may effectively impose a low-pass filter limit on the pump-modulation transfer function, which defines the degree to which any pump modulation of the pump beam 112" is transferred to the seed beam 110.

This effect can be envisioned by considering an intensity fluctuation of duration $T_p$ on the pump beam 112" as it enters the Raman amplifier 108. Due to the limited length L of the fiber, there is a time period $T_L$ for that fluctuation to be transferred to the seed beam 110. The time period $T_L$ is approximately equal to Ln/c, where n is the refractive index of the fiber and c is the speed of light in a vacuum. For fluctuations where $T_p > T_L$, the transfer to the seed beam 110 can be effective due to the long overlap time of the fluctuations with the seed beam 110. For fluctuations where $T_p < T_L$, the effective transfer is proportional to $T_p/T_L$, which systematically decreases for shorter values of $T_p$. Thus, for example, a fiber length of twenty meters may yield a value for $T_L$ of about 100 ns, which leads to an upper limit on the pump modulation transfer bandwidth of about 6 MHz.

Summary of Example Design Characteristics

Overall, a Raman amplifier 108 designed in accordance with the teachings above can have, excluding the third cladding 208, an all fused silica (all glass) structure. The core 202 and the first cladding 204 of the Raman amplifier 108 can be designed to provide a CMAR of two to three or four, and the first cladding 204 can have a numerical aperture that exceeds the BPP of a pump beam 112" to be received by the first cladding 204. In some cases, the core 202 can have a diameter of 20 to 25 μm with a numerical aperture of 0.06 or less, and the first cladding 204 can have a diameter of 35 to 45 μm with a numerical aperture of 0.17 or less. The Raman amplifier 108 can be pumped by diode lasers 118 arranged in multiple arrays 116, where each array 116 has a pump bandwidth of 5 nm or otherwise has a pump bandwidth less than the Raman gain bandwidth of the Raman amplifier 108. The Raman amplifier 108 can be designed to provide a single Stokes shift while simultaneously achieving suitable mode control, and in some cases gain-filtering and/or loss-filtering may be implemented within the Raman amplifier 108. For instance, this may involve doping the core 202 with germanium and doping the first cladding 204 with aluminum and/or doping the first cladding 204 with an absorber such as holmium. Various approaches may optionally be used to suppress stimulated Brillouin scattering as described above, and a counter-pumping approach may optionally be used to suppress the transfer of modulation of the pump beam 112" to the seed beam 110 as described above.

The following table provides example design parameters for a specific implementation of the Raman amplifier 108 and an associated system 100. Note, however, that the Raman amplifier 108 and the associated system 100 may have any other suitable design parameters, including those discussed above.

| Design Parameter | Value |
| --- | --- |
| Core diameter | 25 μm |
| Pump cladding diameter | 45 μm |
| Pump wavelength | 1 μm |
| Raman gain coefficient | 0.01 cm/GW |

-continued

| Design Parameter | Value |
| --- | --- |
| Gain depolarization factor | 0.5 |
| Pump power | 8 kW |
| Fiber length | <20 m |
| gIL | 8.3 |
| Stokes seed | 150 W |
| Frequency modulation (FM) to suppress SBS | 6 GHz |

It should be noted here that a number of the various characteristics or design parameters of the Raman amplifier 108 are dependent on each other. For example, changing the diameter of the core 202 or the cladding 204 can affect the CMAR of the Raman amplifier 108, but this also impacts the modes that can propagate in the core 202 during use and therefore impacts mode control of the Raman amplifier 108. The above designs for the Raman amplifier 108 provide characteristics or design parameters for the Raman amplifier 108 that satisfy the various design challenges described above collectively, thereby helping to provide a Raman amplifier 108 that can achieve both high output power and high beam quality (even at shorter wavelengths, such as 1 µm).

Although FIG. 3 illustrates examples of a numerical aperture profile, doping strategy, and other example features for a Raman amplifier 108 supporting high output power and high beam quality, various changes may be made to FIG. 3. For example, the specific compounds of germanium and aluminum shown here are examples only. Also, although FIG. 4 illustrates one example of an absorption profile produced in a pump cladding 204 of a Raman amplifier 108, various changes may be made to FIG. 4. For instance, absorbers other than holmium may be used in the cladding 204.

Figure 5:
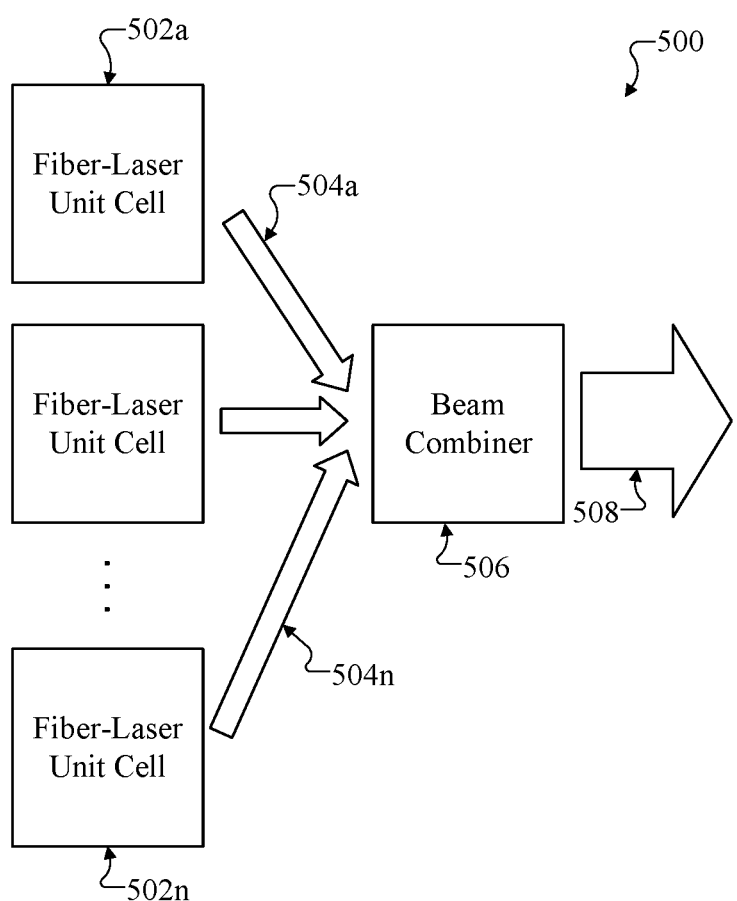
FIG. 5 illustrates an example application for a Raman amplifier supporting high output power and high beam quality according to this disclosure.

FIG. 5 illustrates an example application for a Raman amplifier 108 supporting high output power and high beam quality according to this disclosure. More specifically, FIG. 5 illustrates an example high-energy laser (HEL) system 500 that includes multiple fiber-laser unit cells 502a-502n, which generate various output beams 504a-504n. Each of the fiber-laser unit cells 502a-502n may be implemented as shown in FIG. 1, meaning each of the output beams 504a-504n may represent a different instance of an amplified output beam 114. Thus, in some embodiments, each of the output beams 504a-504n may have an output power of up to 6 kW to 8 kW or more, an M² beam quality of 1.4 or less, and an optical efficiency of at least 70%.

A beam combiner 506 combines the output beams 504a-504n to produce an HEL beam 508, which represents a beam having a power greater than the individual output beams 504a-504n. The beam combiner 506 may use any suitable technique to combine the output beams 504a-504n. For example, the beam combiner 506 may represent a spectral beam combiner or a coherent beam combiner. The HEL beam 508 may then be used in any suitable manner.

There are various commercial and other applications for HEL systems that may benefit from the approaches described in this patent document. For instance, as noted above, a high-energy laser can be used in a telecommunication system to support the transport of information over very long distances. As other examples, in commercial mining applications like drilling, mining, or coring operations, a high-energy laser can be used to soften or weaken an earth bed prior to drilling, which may allow for fewer drill bit changes and extended lifetimes and reliabilities of drill bits. In remote laser welding, cutting, drilling, or heat treating operations like industrial or other automation settings, a high-energy laser can be used to allow for the processing of thicker materials at larger working distances from the laser system while minimizing the heat-affected zone and maintaining vertical or other cut lines. This helps to support welding or cutting operations where proximity to the weld or cut site is difficult or hazardous and helps to protect the laser system and possibly any human operators from smoke, debris, or other harmful materials. In construction and demolition operations like metal resurfacing or deslagging, paint removal, and industrial demolition operations, a high-energy laser can be used to ablate material much faster and safer compared to conventional operations. As a particular example of this functionality, a high-energy laser can be used to support demolition of nuclear reactors or other hazardous structures, such as by cutting through contaminated structures like contaminated concrete or nuclear containment vessels or reactors from long distances. This avoids the use of water jet cutting or other techniques (which creates contaminated water or other hazardous waste) and provides improved safety (since human operators can remain farther away from contaminated structures being demolished). A number of additional applications are possible, such as with a high-energy laser in power beaming applications (where a beam is targeted to photovoltaic cells of remote devices to be recharged) or hazardous material applications (where a beam is used to heat and decompose hazardous materials into less harmful or non-harmful materials).

Although FIG. 5 illustrates one example of an application for a Raman amplifier 108 supporting high output power and high beam quality, various changes may be made to FIG. 5. For example, the HEL system 500 may include any suitable number of fiber-laser unit cells, which can be based on the total desired output power in the HEL beam 508. Also, one or more Raman amplifiers 108 may be used in any other suitable application.

Figure 6:
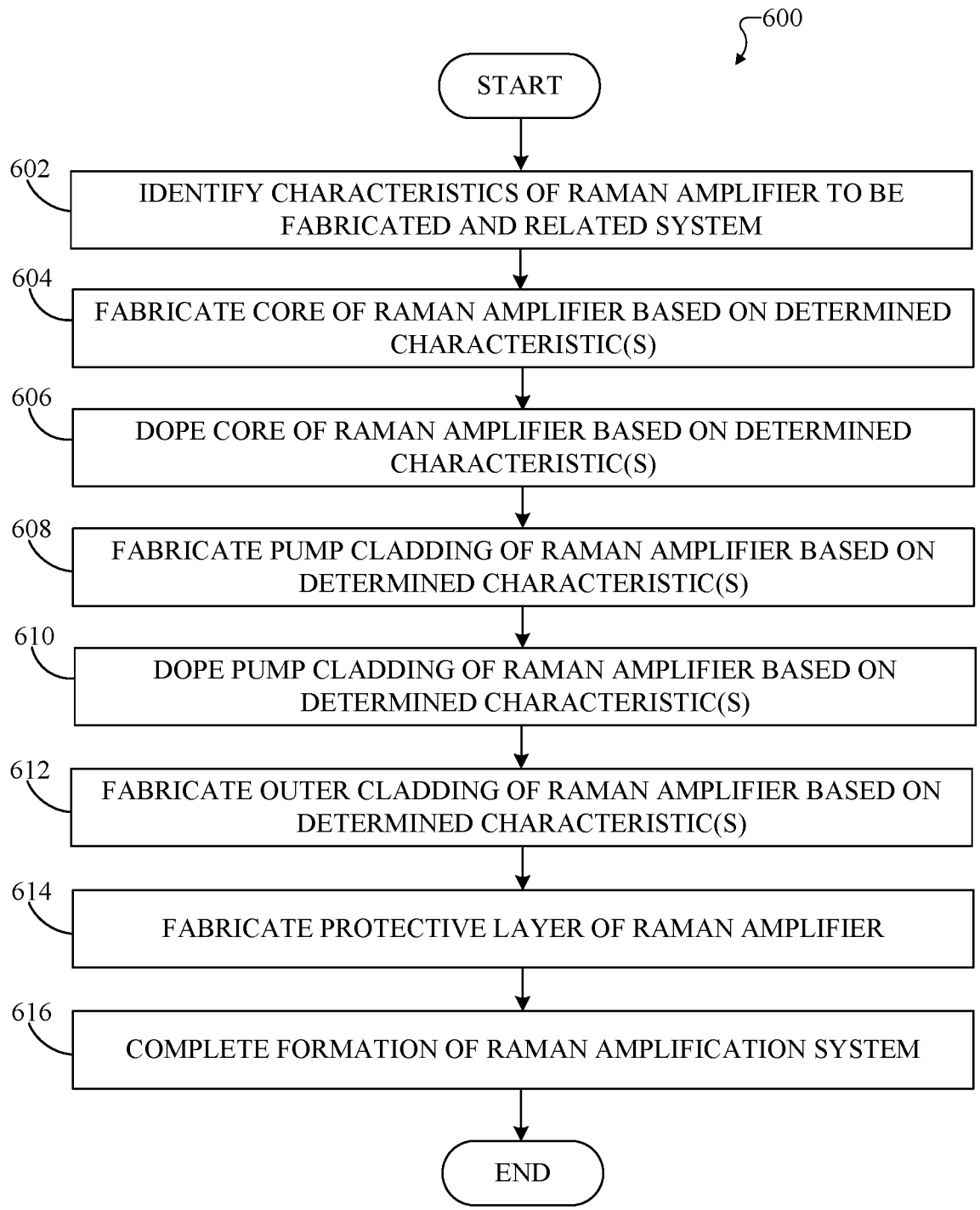
FIG. 6 illustrates an example method for forming a Raman amplifier supporting high output power and high beam quality according to this disclosure.

FIG. 6 illustrates an example method 600 for forming a Raman amplifier supporting high output power and high beam quality according to this disclosure. For ease of explanation, the method 600 is described as being used to form the Raman amplifier 108, which may be used in the system 100 of FIG. 1. However, the method 600 may be used to form any other suitable Raman amplifier for use in any other suitable system.

As shown in FIG. 6, various characteristics or design parameters of both a Raman amplifier to be fabricated as well as a related system are identified at step 602. This may include, for example, selecting diameters for the core 202, first cladding 204, and second cladding 206 to achieve a CMAR of between two to three or four, a numerical aperture for the first cladding 204 (such as 0.17 or less) that (combined with the diameter of the first cladding 204) meets or exceeds the BPP of a pump beam 112″ to be provided to the first cladding 204, and a numerical aperture for the core 202 (such as 0.06 or less) suitable for receipt of the seed beam 110 to be provided to the core 202. Example diameters, numerical apertures, and other values are provided above. Any desired mode control, stimulated Brillouin scattering suppression, or pump-modulation transfer suppression mechanisms may also be selected in this step. Example techniques for mode control, stimulated Brillouin scattering suppression, and pump-modulation transfer suppression are provided above. This may also include identifying a number of arrays 116 of diode lasers 118 to be used to pump the Raman amplifier 108, along with a desired bandwidth (such as 5 nm) associated with each array 116.

A core of the Raman amplifier is fabricated at step 604 and doped at step 606 based on one or more of the identified characteristics. This may include, for example, fabricating a core 202 from fused silica and having a desired diameter. This may also include doping the core 202 with a suitable amount of germanium, such as via diffusion or other suitable technique, to achieve a desired refractive index, numerical aperture, and Raman gain for the core 202. Note that the order of steps here can vary, such as when the fused silica is formed, doped, and machined to a desired final size and shape for the core 202.

A pump cladding of the Raman amplifier is fabricated at step 608 and doped at step 610 based on one or more of the identified characteristics. This may include, for example, fabricating a first cladding 204 on the core 202 from fused silica and having a desired diameter. This may also include doping the first cladding 204 with a suitable amount of aluminum, such as via diffusion or other suitable technique, to achieve a desired refractive index and numerical aperture for the first cladding 204. This may further include doping the first cladding 204 with a suitable amount of holmium or other absorber, such as via diffusion or other suitable technique, to provide loss filtering. Again, note that the order of steps here can vary, such as when the fused silica is formed, doped, and machined to a desired final size and shape for the cladding 204.

An outer cladding of the Raman amplifier is fabricated at step 612 based on one or more of the identified characteristics. This may include, for example, fabricating a second cladding 206 on the first cladding 204 from fused silica and having a desired diameter. The second cladding 206 may or may not be doped to achieve a desired refractive index for the second cladding 206. A protective layer of the Raman amplifier may be fabricated at step 614. This may include, for example, fabricating a polymer layer or other protective third cladding 208 on the second cladding 206. Formation of a Raman amplification system is completed using the Raman amplifier at step 616. This may include, for example, installing the Raman amplifier 108 in a system that includes a seed laser 102 and a pump source 104, where the pump source 104 includes the expected numbers of arrays 116 of diode lasers 118.

Although FIG. 6 illustrates one example of a method 600 for forming a Raman amplifier supporting high output power and high beam quality, various changes may be made to FIG. 6. For example, while shown as a series of steps, various steps in FIG. 6 may overlap, occur in parallel, occur in a different order, or occur any number of times.

Figure 7:
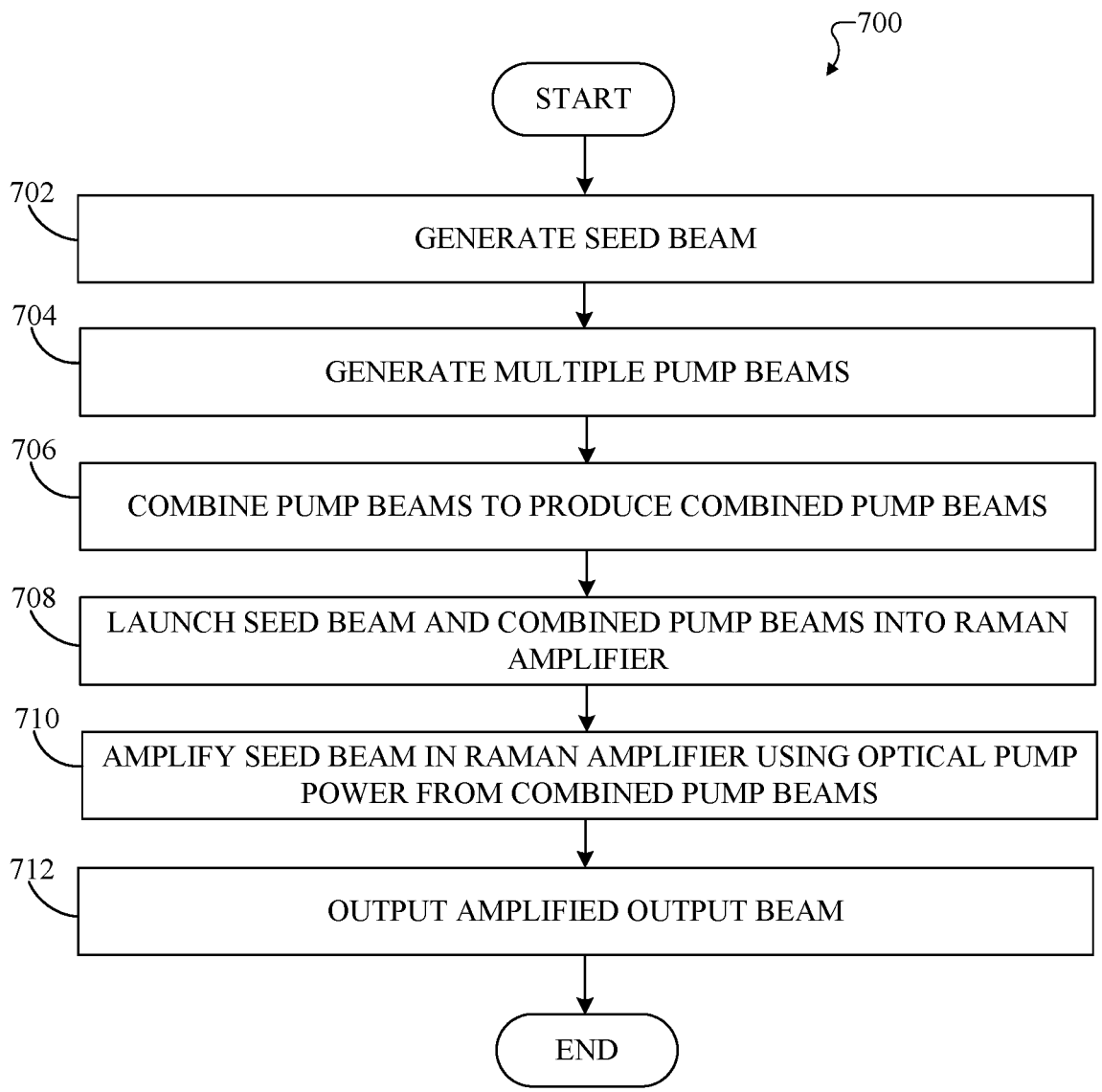
FIG. 7 illustrates an example method for using a Raman amplifier supporting high output power and high beam quality according to this disclosure.

FIG. 7 illustrates an example method 700 for using a Raman amplifier supporting high output power and high beam quality according to this disclosure. For ease of explanation, the method 700 is described as using the Raman amplifier 108 in the system 100 of FIG. 1. However, the method 700 may be used to form any other suitable Raman amplifier for use in any other suitable system.

As shown in FIG. 7, a seed beam is generated at step 702, and multiple pump beams are generated at step 704. This may include, for example, generating a seed beam 110 using a seed laser 102 and generating multiple individual pump beams 112 using multiple arrays 116 of semiconductor diode lasers 118. The multiple pump beams can be combined into combined pump beams at step 706. This may include, for example, combining the pump beams 112 using the spectral beam combiners 120 to produce the combined pump beams 112'.

The combined pump beams and the seed beam are launched or otherwise provided to a Raman amplifier at step 708. This may include, for example, providing the combined pump beams 112' and the seed beam 110 to the pump/seed beam combiner 106. This may also include the pump/seed beam combiner 106 providing the combined pump beams 112' (as the input pump beam 112") and the seed beam 110 into the Raman amplifier 108. This might include spatially-overlapping the pump beam 112" and the seed beam 110. Note that the input pump beam 112" and the seed beam 110 may be launched into the same end of the Raman amplifier 108 or into opposite ends of the Raman amplifier 108.

The seed beam is amplified in the Raman amplifier using optical pump power from the combined pump beams at step 710 and produces an amplified output beam at step 712. This may include, for example, the core 202 of the Raman amplifier 108 amplifying the seed beam 110 using the optical pump power from the pump beam 112" received by the core 202 and first cladding 204 to produce the amplified output beam 114.

Although FIG. 7 illustrates one example of a method 700 for using a Raman amplifier supporting high output power and high beam quality, various changes may be made to FIG. 7. For example, while shown as a series of steps, various steps in FIG. 7 may overlap, occur in parallel, occur in a different order, or occur any number of times.

Note that in the description above, various numerical values are routinely provided for characteristics or properties such as CMAR values, thicknesses/diameters, frequencies, wavelengths, numerical apertures, and doping percentages. These numerical values may vary to some extent based on a number of factors, such as manufacturing tolerances and environmental conditions. Thus, these characteristics or properties may vary somewhat from the stated numerical values. The terms "about" or "approximately," when used in conjunction with a numerical value in this patent document, refer to being within 10% of the numerical value.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in this patent document should not be read as implying that any particular element, step, or function is an essential or critical element that must be included in the claim scope. Also, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," "processing device," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments (including embodiments with certain dimensions, aspect ratios, index values, and other parameters) and generally associated methods, it is important to recognize that alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A system comprising:
a seed laser configured to generate a seed beam;
multiple arrays of semiconductor diode lasers configured to generate multiple pump beams; and
a Raman amplifier comprising a core, a first cladding around the core, and at least a second cladding around the first cladding;
wherein the core is configured to amplify the seed beam based on optical pump power provided by the pump beams;
wherein each of the core, the first cladding, and the second cladding comprises fused silica;
wherein (i) the core is doped with a first doping and a second doping and (ii) the first cladding is doped with an absorption material that is absorptive at a wavelength of the seed beam and less absorptive at a wavelength of the pump beams to support loss filtering;
wherein the core has a numerical aperture of approximately 0.06 or less and a diameter of approximately 20 µm to approximately 25 µm; and
wherein the first cladding has a numerical aperture of approximately 0.17 or less and a diameter of approximately 35 µm to approximately 45 µm.

2. The system of claim 1, further comprising:
at least one spectral beam combiner configured to combine the pump beams from the semiconductor diode lasers in at least one of the arrays to produce at least one spectrally-combined pump beam;
wherein the core is configured to amplify the seed beam based on optical pump power provided by the at least one spectrally-combined pump beam.

3. The system of claim 2, wherein each spectrally-combined pump beam has a maximum total spectral bandwidth of approximately 5 nm.

4. The system of claim 2, further comprising:
a pump/seed beam combiner configured to spatially overlap the at least one spectrally-combined pump beam and the seed beam and to provide the spatially overlapped beams to the Raman amplifier.

5. The system of claim 1, wherein the fused silica in the core is doped with at least one of germanium and aluminum, which at least one of: (i) increases a Raman gain of the core, and (ii) supports gain filtering in favor of a fundamental optical mode in the core.

6. The system of claim 1, wherein the absorption material comprises holmium.

7. The system of claim 1, wherein:
dimensions of the core and the first cladding are configured to limit the core to performing a single Stokes shift relative to a wavelength of the pump beams; and
a cladding-to-mode area ratio (CMAR) of the Raman amplifier is based on a cross-sectional area of the first cladding and a cross-sectional area of a fundamental mode of the core and has a value of approximately two to approximately four.

8. The system of claim 1, wherein the Raman amplifier is configured to suppress modulation of the seed beam based on temporal fluctuations in an intensity of the optical pump power provided by the pump beams.

9. The system of claim 1, wherein the Raman amplifier is configured to suppress stimulated Brillouin scattering in the core.

10. The system of claim 1, wherein the Raman amplifier is configured to generate an amplified output beam having an output power of approximately 6 kW or more, an $M^2$ beam quality of approximately 1.4 or less, and an optical efficiency of approximately 70% or more.

11. The system of claim 1, wherein:
the seed beam has a wavelength of approximately 1 µm to approximately 1.1 µm;
each of the pump beams has a wavelength of approximately 0.95 µm to approximately 1.05 µm;
the diameter of the core is approximately 25 µm; and
the diameter of the first cladding is approximately 45 µm.

12. An apparatus comprising:
a Raman amplifier comprising a core, a first cladding around the core, and at least a second cladding around the first cladding;
wherein the core is configured to receive a seed beam;
wherein the core and the first cladding are configured to receive at least one pump beam, the core configured to amplify the seed beam based on optical pump power provided by the at least one pump beam;
wherein each of the core, the first cladding, and the second cladding comprises fused silica;
wherein (i) the core is doped with a first doping and a second doping and (ii) the first cladding is doped with an absorption material that is absorptive at a wavelength of the seed beam and less absorptive at a wavelength of the pump beams to support loss filtering;
wherein the core has a numerical aperture of approximately 0.06 or less and a diameter of approximately 20 µm to approximately 25 µm; and
wherein the first cladding has a numerical aperture of approximately 0.17 or less and a diameter of approximately 35 µm to approximately 45 µm.

13. The apparatus of claim 12, further comprising:
at least one spectral beam combiner configured to combine multiple individual semiconductor diode beams to produce at least one spectrally-combined pump beam;
wherein the core and the first cladding are configured to receive the at least one spectrally-combined pump beam.

14. The apparatus of claim 12, wherein the fused silica in the core is doped with at least one of germanium and aluminum, which at least one of: (i) increases a Raman gain of the core, and (ii) supports gain filtering in favor of a fundamental optical mode in the core.

15. The apparatus of claim 12, wherein the absorption material comprises holmium.

16. The apparatus of claim 12, wherein:
dimensions of the core and the first cladding are configured to limit the core to performing a single Stokes shift relative to a wavelength of the at least one pump beam; and
a cladding-to-mode area ratio (CMAR) of the Raman amplifier is based on a cross-sectional area of the first cladding and a cross-sectional area of a fundamental mode of the core and has a value of approximately two to approximately four.

17. The apparatus of claim 12, wherein the Raman amplifier is configured to suppress modulation of the seed beam based on temporal fluctuations in an intensity of the optical pump power provided by the at least one pump beam.

18. The apparatus of claim 12, wherein the Raman amplifier is configured to suppress stimulated Brillouin scattering in the core.

19. The apparatus of claim 12, wherein the Raman amplifier is configured to generate an amplified output beam having an output power of approximately 6 kW or more, an AV beam quality of approximately 1.4 or less, and an optical efficiency of approximately 70% or more.

20. The apparatus of claim 12, wherein:
the seed beam has a wavelength of approximately 1 μm to approximately 1.1 μm;
each of the at least one pump beam has a wavelength of approximately 0.95 μm to approximately 1.05 μm;
the diameter of the core is approximately 25 μm; and
the diameter of the first cladding is approximately 45 μm.

21. A method comprising:
receiving a seed beam and at least one pump beam at a Raman amplifier, the Raman amplifier comprising a core, a first cladding around the core, and at least a second cladding around the first cladding; and
amplifying the seed beam in the core of the Raman amplifier based on optical pump power provided by the at least one pump beam;
wherein each of the core, the first cladding, and the second cladding comprises fused silica;
wherein (i) the core is doped with a first doping and a second doping and (ii) the first cladding is doped with an absorption material that is absorptive at a wavelength of the seed beam and less absorptive at a wavelength of the pump beams to support loss filtering;
wherein the core has a numerical aperture of approximately 0.06 or less and a diameter of approximately 20 μm to approximately 25 μm; and
wherein the first cladding has a numerical aperture of approximately 0.17 or less and a diameter of approximately 35 μm to approximately 45 μm.

22. The method of claim 21, further comprising:
generating multiple individual pump beams using multiple arrays of semiconductor diode lasers; and
spectrally combining the individual pump beams from the semiconductor diode lasers in at least one of the arrays to produce at least one spectrally-combined pump beam;
wherein the core amplifies the seed beam based on optical pump power provided by the at least one spectrally-combined pump beam.

23. The method of claim 21, wherein the absorption material comprises holmium.

24. The method of claim 21, wherein:
the seed beam has a wavelength of approximately 1 μm to approximately 1.1 μm;
each of the at least one pump beam has a wavelength of approximately 0.95 μm to approximately 1.05 μm;
the diameter of the core is approximately 25 μm; and
the diameter of the first cladding is approximately 45 μm.

* * * * *